United States Patent
Wang et al.

(10) Patent No.: US 10,515,854 B2
(45) Date of Patent: Dec. 24, 2019

(54) LASER LIFT-OFF METHOD OF WAFER

(71) Applicant: HAN'S LASER TECHNOLOGY INDUSTRY GROUP CO., LTD., Shenzhen (CN)

(72) Inventors: Yanhua Wang, Shenzhen (CN); Changhui Zhuang, Shenzhen (CN); Fuhai Li, Shenzhen (CN); Wei Zeng, Shenzhen (CN); Wei Zhu, Shenzhen (CN); Jiangang Yin, Shenzhen (CN); Yunfeng Gao, Shenzhen (CN)

(73) Assignee: Han's Laser Technology Industry Group Co., Ltd., Shenzhen (CN)

( * ) Notice: Subject to any disclaimer, the term of this patent is extended or adjusted under 35 U.S.C. 154(b) by 13 days.

(21) Appl. No.: 15/322,065

(22) PCT Filed: Aug. 30, 2016

(86) PCT No.: PCT/CN2016/097399
§ 371 (c)(1),
(2) Date: Dec. 23, 2016

(87) PCT Pub. No.: WO2017/113844
PCT Pub. Date: Jul. 6, 2017

(65) Prior Publication Data
US 2018/0108568 A1    Apr. 19, 2018

(30) Foreign Application Priority Data
Dec. 30, 2015   (CN) .......................... 2015 1 1020496

(51) Int. Cl.
*H01L 21/78*    (2006.01)
*B23K 26/53*    (2014.01)
(Continued)

(52) U.S. Cl.
CPC ...... *H01L 21/7813* (2013.01); *B23K 26/0006* (2013.01); *B23K 26/02* (2013.01);
(Continued)

(58) Field of Classification Search
CPC .......................... B23K 26/02; B23K 26/0057; B23K 2201/40; B23K 26/0006; B23K 26/38;
(Continued)

(56) References Cited

U.S. PATENT DOCUMENTS 7,592,238 B2 *   9/2009   Fukuyo ................. B23K 26/03
                                                            438/463
9,530,929 B2 *  12/2016   Morikazu ........... H01L 33/0066
(Continued)

FOREIGN PATENT DOCUMENTS

BY         14622       8/2011
CN    101218664 A      7/2008
(Continued)

OTHER PUBLICATIONS

Newton's Third Law.*
(Continued)

*Primary Examiner* — Michael G Hoang
(74) *Attorney, Agent, or Firm* — HoustonHogle LLP

(57) ABSTRACT

The present invention relates to a laser lift-off method of wafer. The method includes the steps as follows: focusing laser in an inside for a wafer (10) to form a plurality of cracking points (19), the plurality of cracking points (19) are located on a separating surface (20); and exerting, under a temperature of −400K to 0K, forces with opposite directions to opposite sides of the wafer (10), thereby dividing the wafer (10) into two pieces along the separating surface (20).

15 Claims, 4 Drawing Sheets

(51) Int. Cl.
*B23K 26/402* (2014.01)
*B23K 26/38* (2014.01)
*B23K 26/0622* (2014.01)
*B23K 26/00* (2014.01)
*B23K 26/02* (2014.01)
*C01B 33/02* (2006.01)
*B23K 101/40* (2006.01)
*B23K 103/00* (2006.01)

(52) U.S. Cl.
CPC .......... *B23K 26/0622* (2015.10); *B23K 26/38* (2013.01); *B23K 26/402* (2013.01); *B23K 26/53* (2015.10); *B23K 2101/40* (2018.08); *B23K 2103/50* (2018.08)

(58) Field of Classification Search
CPC .. B23K 26/402; B23K 26/0622; B23K 26/53; B23K 2101/40; B23K 2103/50; H01L 21/7813
USPC .......................... 219/121.67–121.69; 438/464
See application file for complete search history.

(56) References Cited

U.S. PATENT DOCUMENTS

| | | | | |
|---|---|---|---|---|
| 2003/0015494 A1* | 1/2003 | Jayashankar | ........... | G03F 7/428 216/63 |
| 2006/0219676 A1* | 10/2006 | Taylor | ................... | B82Y 20/00 219/121.69 |
| 2007/0007472 A1 | 1/2007 | Genda | | |
| 2008/0286594 A1 | 11/2008 | Inada et al. | | |
| 2011/0183449 A1* | 7/2011 | Ryu | ..................... | H01L 21/268 438/22 |
| 2012/0234808 A1* | 9/2012 | Nakano | ................... | B23K 26/03 219/121.72 |
| 2014/0038392 A1* | 2/2014 | Yonehara | .............. | H01L 21/304 438/463 |
| 2014/0057413 A1 | 2/2014 | Yang | | |
| 2015/0328872 A1* | 11/2015 | Koyanagi | .......... | B23K 26/0853 156/73.1 |
| 2015/0368833 A1* | 12/2015 | Farah | .................... | H01L 31/184 117/58 |
| 2016/0074960 A1* | 3/2016 | Hirata | ................ | B23K 26/0057 225/2 |

FOREIGN PATENT DOCUMENTS

| | | |
|---|---|---|
| CN | 101355122 A | 1/2009 |
| CN | 102672347 A | 9/2012 |
| CN | 103831527 A | 6/2014 |
| CN | 105436710 A | 3/2016 |
| DE | 102005030670 A1 | 5/2006 |
| EP | 0863231 B1 | 8/2001 |
| FR | 2955275 A1 | 7/2011 |
| JP | 2009195944 A | 9/2009 |
| JP | 2013157545 A | 8/2013 |
| RU | 2059575 | 5/1996 |
| SU | 1827696 | 7/1993 |
| WO | WO 2015052220 | 4/2015 |

OTHER PUBLICATIONS

Russian Search Report completed on Aug. 9, 2018 from Russian Patent Application No. 2016147223/02(075804), filed on Aug. 30, 2016. 2 pages.

* cited by examiner

LASER LIFT-OFF METHOD OF WAFER

RELATED APPLICATIONS

This Application is a § 371 National Phase Application of International Application No. PCT/CN2016/097399, filed on Aug. 30, 2016, which claims priority to Chinese Application No. CN 201511020496.X, entitled "LASER LIFT-OFF METHOD OF WAFER", filed Dec. 30, 2015. The entire teachings of the above applications are incorporated herein by reference.

FIELD OF THE INVENTION

The present disclosure relates to a field of laser microprocessing, and more particularly relates to a laser lift-off method for a wafer.

BACKGROUND OF THE INVENTION

In the industry of silicon wafer semiconductor, in order to obtain a single silicon wafer having a relative less thickness, at present, the conventional processing method is to cut the crystal bar by a wire-electrode cutting method first, and then the crystal bar is grinded and thinned to a predetermined thickness. The disadvantage of the processing method is wasting material; quite a lot of silicon wafer is grinded in the grinding process, thus causing a loss of materials.

Due to a development of the semiconductor industry and a continuous promotion of a consciousness of energy conservation and environment protection, a more scientific and lossless processing method is to be developed, a laser lift-off technology is initially applied to the silicon wafer lift-off industry, but the existing lift-off technology has some defects. A laser lift-off device of crystal silicon wafer adopts a hollow rotation shaft to cause the laser extending though the rotation shaft to cut the silicon ingot along a determined angle, not only the laser extending through a focus lens can be focused on a surface of the silicon wafer to be cut, but also enables the laser focus head to be not influenced when the residual silicon ingot moves. However, it merely adopts a laser to perform a high power radiation processing, due to the high power of the laser and the fragility of the silicon ingot, the silicon ingot generates cracks easily, thereby causing the whole silicon ingot processes a greater process scrapping risk.

SUMMARY

Therefore, it is necessary to provide a laser lift-off method for a wafer to solve the problems of wasting material and a big scrapping risk.

A laser lift-off method for a wafer includes: focusing a laser into an inside for a wafer to form a plurality of cracking points, the plurality of cracking points being located on a separating surface; and exerting, under a temperature of −400K to 0K, forces with opposite directions to opposite sides of the wafer, thereby dividing the wafer into two pieces along the separating surface.

In the above laser lift-off method, a plurality of cracking points are formed in the inside of the wafer, the wafer on opposite sides of the flat surface on which the cracking points located on are pulled along opposite directions under a low temperature condition, causing the wafer to be separated along the cracking points. Because it is performed under a low temperature condition, the wafer can be efficiently separated along the flat surface formed by the plurality of cracking points, it is difficult to generate new cracks along other directions, and finally a seamless separation of the wafer is achieved. The surface of the separated wafer is smooth and even. The process yield is high and it is suitable for mass production.

BRIEF DESCRIPTION OF THE DRAWINGS

To illustrate the technical solutions according to the embodiments of the present invention or in the prior art more clearly, the accompanying drawings for describing the embodiments or the prior art are introduced briefly in the following. Apparently, the accompanying drawings in the following description are only some embodiments of the present invention, and persons of ordinary skill in the art can derive other drawings from the accompanying drawings without creative efforts.

DETAILED DESCRIPTION OF THE EMBODIMENTS

The foregoing and other objects, features and advantages will be apparent from the following description of particular embodiments of the invention, as illustrated in the accompanying drawings. It should be noted that, the specific embodiment illustrated herein is merely for the purpose of illustration, and should not be deemed to limit the invention.

Figure 1:
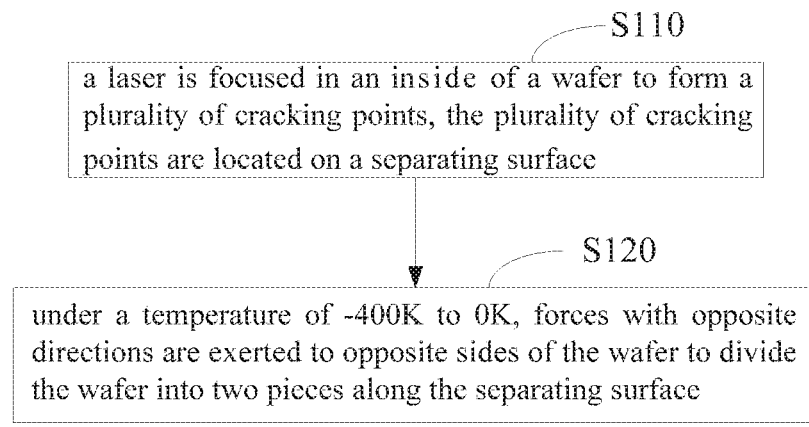
FIG. 1 is a flow chart of a laser lift-off method of a silicon wafer according to an embodiment.

As shown in FIG. 1, a laser lift-off method of a silicon wafer 10 according to an embodiment includes the following steps:

In step S110, a laser is focused to an inside of a silicon wafer to form a plurality of cracking points, the plurality of cracking points are located on a separating surface. Specifically, the laser is focused on a flat surface in the silicon wafer to form a plurality of cracking points. For example, the plurality of cracking points are located on a same flat surface, the flat surface is the separating surface. For example, the plurality of cracking points are not located on a same flat surface, thus the plurality of cracking points are fitted into a curved surface, or are fitted into a flat surface after removing noise. For example, the laser also can be focused in a cross-section of the silicon wafer to form the plurality of cracking points, in the embodiment, the separating surface is flat. For example, the separating surface can also be a curved surface. It is apparently, above method is not limited to a lift-off of the silicon wafer, it also can be applied to peeling-off material having property similar to that of the silicon wafer.

In step S120, under a temperature of −400K to 0K, forces with opposite directions are exerted to opposite sides of the silicon wafer, thereby dividing the wafer into two pieces along the separating surface. Specifically, under a low temperature condition, an upper surface and a lower surface of the silicon wafer are pulled along opposite directions, and the silicon wafer is divided into two pieces.

Figure 2A:
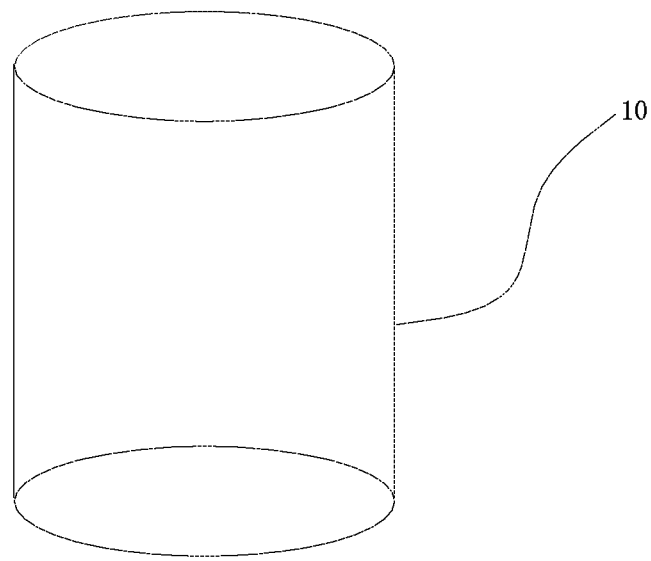
FIGS. 2a, 2b, 2c, and 2d are perspective views of a process sequence of a laser lift-off method of a silicon wafer provided by an embodiment.
Figure 3:
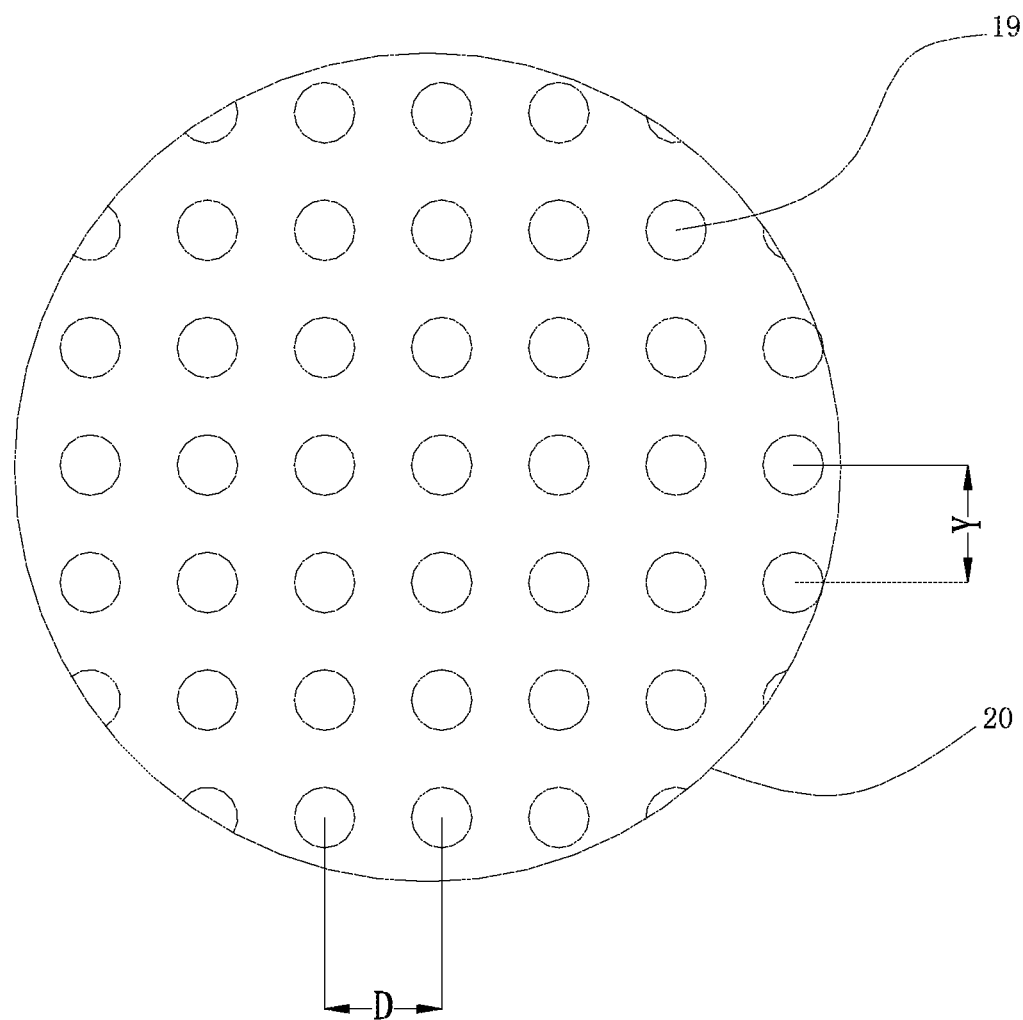
FIG. 3 is a cross-sectional view of inside cracking points of a silicon wafer provided by an embodiment.

Also, referring to FIG. 2a and FIG. 3, in the laser lift-off method according to the embodiment, a plurality of cracking points are formed in the inside of the silicon wafer 10 first, and then under a low temperature condition, the silicon wafer on opposite sides of the cracking points 19 are pulled along opposite directions, causing the silicon wafer 10 to be separated from the cracking points 19. Because it is performed under a low temperature condition, the silicon wafer is separated along the flat surface formed by the plurality of cracking points, it is difficult to generate new cracks along other directions, and finally a seamless separation of the silicon wafer is achieved. The surface of the separated silicon wafer is smooth and even. The process yield is high and it is suitable for a mass production. Specifically, the temperature when pulling and dividing the silicon wafer ranges from −400K to 0K, under the low temperature condition, the silicon wafer is separated along the flat surface formed by the plurality of cracking points, it is difficult to generate new cracks along other directions.

Further, prior to step S120, the upper surface and the lower surface of the silicon wafer is adhered to two substrates 15;

In step S120, opposite sides of the silicon wafer are adhered to two substrates; the two substrates are pulled along opposite directions, thereby dividing the silicon wafer into two pieces along the separating surface. For example, the two substrates 15 are pulled along opposite directions to divide the silicon wafer 10 into two pieces along the separating surface; and then the substrate is separated from the silicon wafer, and the two pieces of silicon wafer are cleaned.

Figure 2B:
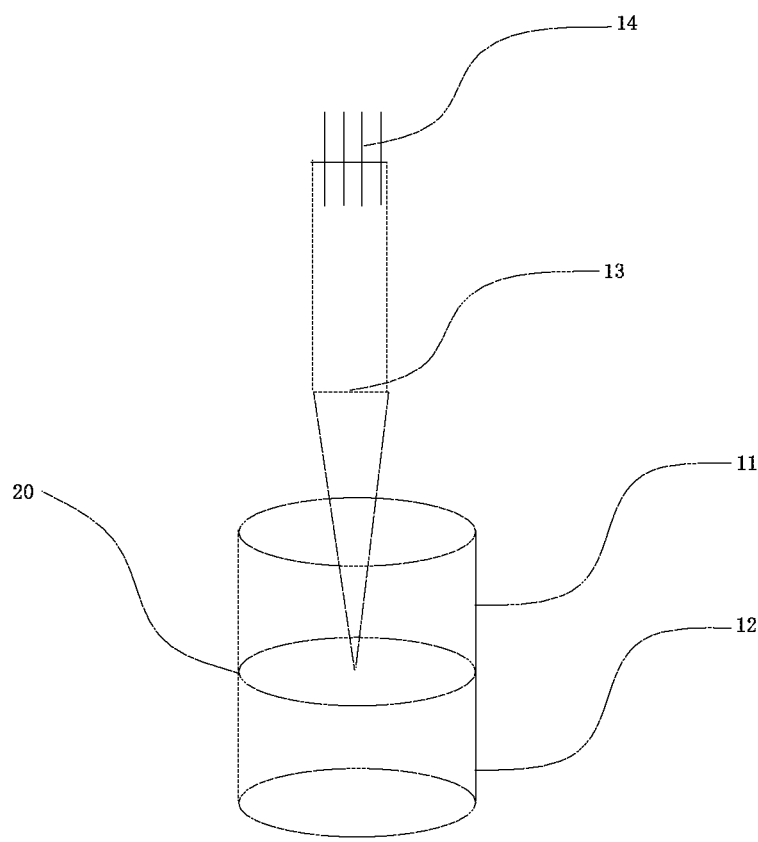
Figure 2C:
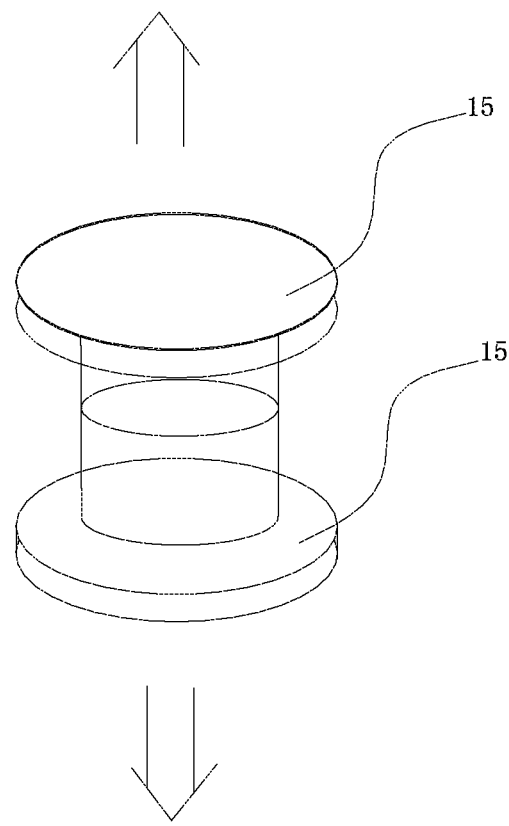
Figure 2D:
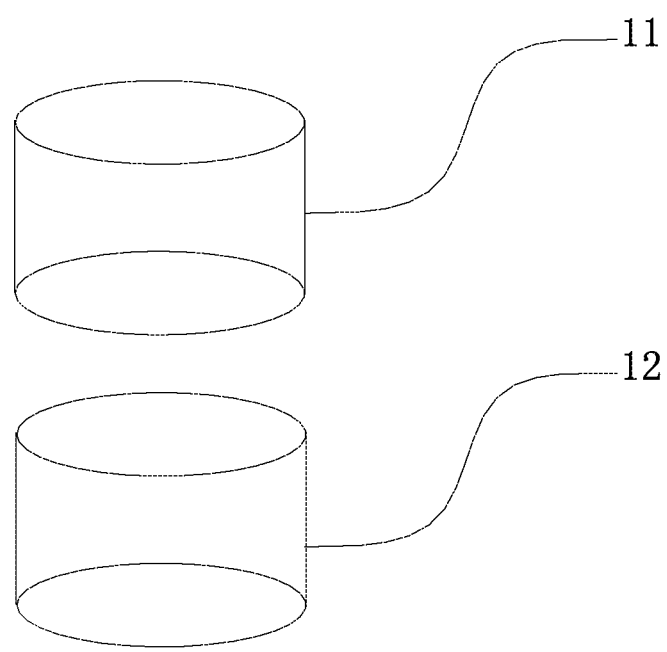

As shown in FIGS. 2a, 2b and FIG. 3, the silicon wafer 10 is horizontally placed upon a working table (not shown), and then a laser 14 extends through a focusing lens 13 and is focused, the focal point is located on an inside of the silicon wafer 13, and a plurality of cracking points 19 are formed in the inside of the silicon wafer. The plurality of cracking points 19 are located on a same separating surface 20, the silicon wafer 10 is divided into an upper portion and a lower portion (the silicon wafer 11, 12) by a flat surface formed by the cracking points 19. As shown in FIG. 2c, under the low temperature, the upper surface and the lower surface of the silicon wafer which forms the plurality of cracking points 19 are pulled along opposite directions. In the embodiment, the separating surface is a cross-section of the silicon wafer, the plurality of cracking points are uniformly distributed on the separating surface. In order to uniformly distribute the pulling force on the silicon wafer 10 uniformly, the upper surface and the lower surface are adhered to the substrates 15 having a same shape, and then an external force is applied to the substrate 15, and two individual silicon wafers (11, 12) as shown in FIG. 2d are obtained; finally, the substrates 15 are separated from the silicon wafer, and then the two silicon wafers (11, 12) are washed.

It is apparently, in alternative embodiments, external forces are applied to the upper portion and the lower portion of the silicon wafer which forms the plurality of cracking points 19 to perform a pull action by other methods, for example, an absorption manner is adopted, the upper surface and the lower surface of the silicon wafer 10 are absorbed to perform a pulling action.

Further, the separating surface 20 in the inside of the silicon wafer 10 is parallel to the upper surface and the lower surface of the silicon wafer 10, causing the upper surfaces of the separated silicon wafers to be parallel to the lower surfaces of the separated silicon wafers (11, 12), which meets a requirement of a subsequently use. It is apparently, in alternative embodiments, they are unparallel, and it is adjusted according to a requirement, if only all the cracking points 19 are guaranteed to be located on one flat surface. For example, the waste material is processed, the shapes of the waste materials are possibly irregular, thus the flat surface 20 in the inside of the silicon wafer 10 and the horizontal surface may define an angle, and then another flat surface parallel to the angle is processed many times, and the silicon wafer meeting a requirement is obtained from the waste materials.

Further, in order to guarantee a separation, the inner of the silicon wafer bears a uniformly force, and unnecessary cracks are avoided, the plurality of cracking points 19 are uniformly distributed on a flat surface in the inside of the silicon wafer. Specifically, as shown in FIG. 3, a distance between adjacent two cracking points ranges from 1 micrometer to 20 micrometers.

Further, the silicon wafer 10 processed by the method provided by the embodiment may have a thickness ranging from 0.1 millimeters to 2 millimeters. Because the thickness of the silicon wafer 10 is relatively less, irregularly or unexpected crack may generally easily when adopting other laser processing method (such as cut directly), thereby scrapping the silicon wafer.

Further, when the laser adopts a linear polarized laser, the effect is better, the surface is more smooth and with less crack. Specifically, a polarization ratio thereof is greater than 50:1.

When the linearly polarized laser process a thinner silicon wafer 10, a laser with a wavelength of 1064 nanometers can be adopted, its frequency ranges from 50 KHz to 500 KHz, a pulse width ranges from 1 nanoseconds to 1000 nanoseconds.

Further, in order to control a size of the crack on the cutting surface, a power of the laser which forms a single cracking point in the inside of the silicon wafer 10 ranges from 0.1 µj to 100 µj.

Further, in order to control a size and a direction of the crack on the cutting surface, a size of a single crack point formed in the inside of the silicon wafer 10 by the laser ranges from 0.1 micrometers to 10 micrometers, i.e. a diameter of each cracking point ranges from 0.1 micrometers to 10 micrometers.

In the illustrated embodiment, the upper surface and the lower surface of the silicon wafer 10 are adhered to the substrates 15 via polymer glue. The polymer glue can be polyvinyl alcohol or vinyl acetate monomer. When the silicon wafer 10 is separated under a low temperature condition, the substrate and the silicon wafer may be separated by heating.

In the step of pulling the substrate along opposite directions under a low temperature condition to divide the wafer into two pieces, specifically, the temperature ranges from −400K to 0K.

In order to concentrate the energy focused by the laser, the focus lens 13 performing a focusing to the laser 14 is a N.A value objective lens, the N.A. value ranges from 0.3 to 0.8, the focusing magnification ranges from 20 to 100.

Further, sizes of the periodic arranged dense laser cracking points 19 from in the inside of the silicon wafer 10 after processing can be changed by adjusting the laser processing parameters. The distance D of the laser cracking points 19 along X direction can be adjusted by changing a velocity V of the working table (X-Y axis type) and a frequency F of the laser, D=V/F, the row pitch Y of the laser cracking points 19 along Y direction can be achieved by configuring the software.

Further, in order to guarantee a consistency of depths of the cracking points 19 in the inner of the silicon wafer 10, when the working table (not shown) drives the silicon wafer 10 to move, a consistency of depths can be guaranteed at real time by an attitude measurement system (not shown).

In the illustrated embodiment, the attitude measurement system includes a distance measuring equipment (not shown), the distance measuring equipment can monitor a thickness vibration of the silicon wafer 10 at real time by a detected voltage, realizing a real time rise or fall of the focal point of the focusing lens 13 according to the thickness vibration of the silicon wafer 10, achieving a guarantee of a stability of the processing depth, and improving a stability of a processing effect and a yield.

The laser lift-off method provided by the embodiment almost achieves a lossless lift-off of the silicon wafer, compared to the conventional wire-electrode cutting method, it can reduce material loss greatly. Compared to the existing laser cutting technology, it can reduce a scrapping of the silicon wafer at most, and has a great applying potential and promotion space in semiconductor industry such as silicon wafer. It is apparently, the laser lift-off method provided by the embodiment is not limited to a lift-off of the silicon wafer, material having property similar to that of the silicon wafer can be operated such method.

The above are further illustration of the present invention with reference to specific embodiment, and should not be deemed as limitations to the scope of the present invention. It should be noted that variations and improvements will become apparent to those skilled in the art to which the present invention pertains without departing from its spirit and scope. Therefore, the scope of the present invention is defined by the appended claims.

What is claimed is:

1. A laser lift-off method for a wafer, comprising:
   focusing light from a laser into an inside of the wafer to form a plurality of cracking points, the plurality of cracking points being located on a separating surface; and
   exerting forces with opposite directions to opposite sides of the wafer, thereby dividing the wafer into two pieces along the separating surface,
   wherein the separating surface is a cross-section of the wafer, the plurality of cracking points are uniformly distributed on the separating surface and a distance between two adjacent cracking points from among the plurality of cracking points ranges from 1 micrometer to 20 micrometers in one of an X-axis direction or Y-axis direction of an X-Y plane of the separating surface,
   wherein exerting forces with opposite directions to opposite sides of the wafer, thereby dividing the wafer into two pieces along the separating surface, comprises:
   (i) adhering opposite sides of the wafer to two substrates via polymer glue, respectively;
   (ii) after the completion of (i), pulling the two substrates away from each other in opposite directions to divide the wafer into two pieces along the separating surface; and
   (iii) after the completion of (ii), separating the substrates from the two pieces of the wafer.

2. The method according to claim 1, wherein the separating surface is flat, and the separating surface is parallel to the opposite sides of the water.

3. The method according to claim 1, wherein the wafer has a thickness ranging from 0.1 millimeters to 2 millimeters.

4. The method according to claim 1, wherein the laser is a linear polarized laser having a polarization ratio greater than 50:1.

5. The method according to claim 1, wherein a diameter of each cracking point of the plurality of cracking points ranges from 0.1 micrometers to 10 micrometers.

6. The method according to claim 1, wherein the light from the laser is linearly polarized.

7. The method according to claim 1, wherein the light from the laser has a wavelength of 1064 nanometers.

8. The method according to claim 1, wherein the light from the laser is modulated at greater than 50 kHz with a pulse width of less than 1000 nanoseconds.

9. The method according to claim 1, wherein the light from the laser is focused by an objective lens having a numerical aperture of between 0.3 and 0.8.

10. The method according to claim 1, wherein the light from the laser is focused in a magnification range of 20 to 100.

11. The method according to claim 1, wherein the light from the laser is directed to the inside of the wafer through a surface of the wafer that is parallel to the separating surface.

12. A laser lift-off method for a silicon wafer, comprising:
    directing laser light through a first surface of the silicon wafer and focusing the laser light into an inside of the silicon wafer to form a plurality of cracking points, the plurality of cracking points being located on a separating surface; and
    exerting forces in opposite directions to opposite sides of the silicon wafer, thereby dividing the silicon wafer into two pieces along the separating surface;
    wherein the separating surface is a cross-section of the silicon wafer and parallel to the first surface, the plurality of cracking points are uniformly distributed on the separating surface and a distance between two adjacent cracking points from among the plurality of cracking points ranges from 1 micrometer to 20 micrometers in one of an X-axis direction or Y-axis direction of an X-Y plane of the separating surface,
    wherein exerting forces in opposite directions to opposite sides of the silicon wafer, thereby dividing the silicon wafer into two pieces along the separating surface, comprises:
    (i) adhering opposite sides of the silicon wafer to two substrates via polymer glue, respectively;
    (ii) after the completion of (i), pulling the two substrates away from each other in opposite directions to divide the silicon wafer into two pieces along the separating surface; and
    (iii) after the completion of (ii) separating the substrates from the two pieces of the silicon wafer.

13. The method according to claim 12, wherein the silicon wafer has a thickness ranging from 0.1 millimeters to 2 millimeters.

14. The method according to claim 13, wherein the laser light has a wavelength of 1064 nanometers, with a linear polarization ratio greater than 50:1, and modulated at greater than 50 kHz with a pulse width of less than 1000 nanoseconds.

15. The method according to claim 14, wherein a single crack point formed inside the silicon wafer by the laser light has a diameter ranging from 0.1 micrometers to 10 micrometers.

* * * * *